United States Patent [19]

McShane et al.

[11] Patent Number: 5,220,195
[45] Date of Patent: Jun. 15, 1993

[54] SEMICONDUCTOR DEVICE HAVING A MULTILAYER LEADFRAME WITH FULL POWER AND GROUND PLANES

[75] Inventors: Michael B. McShane, Austin; Rolando J. Osorio, Manchaca, both of Tex.

[73] Assignee: Motorola, Inc., Schaumburg, Ill.

[21] Appl. No.: 810,599

[22] Filed: Dec. 19, 1991

[51] Int. Cl.$^5$ ............... H01L 23/48; H01L 23/50
[52] U.S. Cl. ................................ 257/666; 257/691
[58] Field of Search .................. 357/70, 74, 80, 68

[56] References Cited

U.S. PATENT DOCUMENTS

| | | | |
|---|---|---|---|
| 4,445,271 | 5/1984 | Grabbe | 29/589 |
| 4,835,120 | 5/1989 | Mallik et al. | 437/209 |
| 4,891,687 | 1/1990 | Mallik et al. | 357/74 |
| 5,032,895 | 7/1991 | Horiuchi et al. | 357/70 |
| 5,053,921 | 10/1991 | Nelson et al. | 361/386 |
| 5,089,878 | 2/1992 | Lee | 357/70 |
| 5,089,881 | 2/1992 | Panicker | 357/74 |

FOREIGN PATENT DOCUMENTS 3-180056  8/1991  Japan ........................... 357/70

OTHER PUBLICATIONS

"Thermal Characteristics of Single and Multilayer High Performance PQFP Packages," by M. Aghazadeh et al., IEEE Transactions on Components, Hybrids, and Manufacturing Technology, vol. 13, No. 4, Dec. 1990, pp. 975-979.

Primary Examiner—Rolf Hille
Assistant Examiner—S. V. Clark
Attorney, Agent, or Firm—Patricia A. Goddard

[57] ABSTRACT

A semiconductor device (10) has a multilayer leadframe (14) with two full voltage planes, specifically an upper voltage plane (16) and a lower voltage plane (18). A semiconductor die (12) is mounted to the upper voltage plane. Bond pads (13) of the die are electrically coupled to appropriate leads (20a, 20b, and 20c) using conductive wires (22). Upper voltage plane (16) is provided with at least one opening (28) to allow passage of a conductive wire through the opening in order to electrically couple a bond pad or a lead to lower voltage plane (18). The voltage planes are attached to the leadframe using welded conductive tabs (24), an electrically insulating adhesive layer (26), or both.

15 Claims, 1 Drawing Sheet

SEMICONDUCTOR DEVICE HAVING A MULTILAYER LEADFRAME WITH FULL POWER AND GROUND PLANES

FIELD OF THE INVENTION

The present invention relates to semiconductor devices in general, and more specifically to semiconductor devices having multilayer leadframes and methods for making the same.

BACKGROUND OF THE INVENTION

High performance semiconductors devices are often packaged in expensive ceramic or metal packages for enhanced electrical performance, at least during the initial stages of product introduction. However as the selling price of the device is driven down, the use of such packages by a semiconductor manufacturer becomes cost ineffective. One of the most common approaches to alleviating packaging costs of high performance devices is to use a plastic package. However, high performance devices have a relatively large pin-count which is not easy to accommodate in a plastic package using conventional single layer leadframes. Use of single layer leadframes in high pin-count devices creates high inductance levels between leads, resulting in undesirable signal noise during simultaneous signal switching. Furthermore, in order to handle the large currents used in high performance devices, a single layer leadframe requires a larger number of power and ground leads, and thus a larger number of power and ground pads on a die, to distribute the additional current. Increasing the number of leads and number of pads contradicts a goal of semiconductor manufacturers which is to minimize device size.

Some semiconductor manufacturers have been able to produce relatively low-cost plastic packages for high performance devices which overcome the above disadvantages by utilizing multilayer leadframes. Conventional multilayer leadframes typically include either a power or a ground voltage plane on which a semiconductor die is mounted. The voltage plane is usually formed from conventional leadframe materials, such as copper, a copper alloy, or a nickel-iron alloy, and is attached to a more or less standard single layer leadframe. Attachment of the voltage plane to a single layer leadframe is often accomplished by using a non-conductive adhesive tape, but may also be done by welding a portion of the plane to one or more leads of the leadframe. While a multilayer leadframe having a full voltage plane is an improvement over conventional single layer leadframes in terms of electrical performance, a disadvantage with such leadframes is that a manufacturer is limited to having either a power plane or a ground plane, but not both.

Another known semiconductor device having a multilayer leadframe combines a first full voltage plane with a second partial voltage plane to improve electrical performance over the one-plane multilayer leadframe design discussed above. In the device, a full voltage plane is attached to a single layer leadframe in a manner similar to that described above. In addition, an annular voltage plane is attached to the top of the full voltage plane, for instance by a non-conductive adhesive tape. A semiconductor die is positioned in the central opening of the annular plane and is attached to the full plane. Power bond pads of the die are wire bonded to one of either the annular plane or the full plane, while ground pads are wire bonded to the remaining voltage plane. A semiconductor device utilizing a multilayer leadframe with one full voltage plane and one partial voltage plane has improved electrical performance over a device having only a single voltage plane. However, a semiconductor manufacturer sacrifices electrical performance because either a power plane or a ground plane is limited in area due to the annular shape of one of the voltage planes.

SUMMARY OF THE INVENTION

The present invention overcomes the disadvantages associated with the prior art discussed above. In one form of the invention, a semiconductor device includes a multilayer leadframe having a plurality of leads and first and second voltage planes. The first and second voltage planes are electrically insulated from one another, with the second plane being positioned above the first. An opening extends completely through the second voltage plane to expose a portion of the first voltage plane. The device also includes a semiconductor die having a plurality of bond pads on a surface thereof. The die is attached to the second voltage plane. A conductive wire electrically couples one of the plurality of bond pads to the exposed portion of the first voltage plane by passing through the opening in the second voltage plane.

These and other features, and advantages, will be more clearly understood from the following detailed description taken in conjunction with the accompanying drawings. It is important to point out that the illustrations may not necessarily be drawn to scale or to proportion, and that there may be other embodiments of the present invention which are not specifically illustrate.

DETAILED DESCRIPTION OF A PREFERRED EMBODIMENT

The present invention enables high performance semiconductor devices to be packaged in low-cost plastic packages with little sacrifice in electrical performance. A device formed in accordance with the present invention has a multilayer leadframe with essentially two full voltage planes, enabling the device to have a power plane and a ground plane with similar areas. The two voltage planes are positioned one above the other. The upper voltage plane is provided with one or more openings which expose the lower voltage plane. The upper voltage plane is electrically coupled to a semiconductor die using wire bond techniques, and the lower voltage plane is electrically coupled to the die by a conductive wire which passes through one of the openings in the upper voltage plane. Advantages of using two full voltage planes in comparison to prior art devices include: 1) a reduction in simultaneous signal switching noise due to lower inductance between leads; and 2) improved thermal dissipation properties due to an increase in thermally conductive area. Additional advantages of the present invention are that a device in accordance with the present invention can be manufactured using existing wire bonding equipment and that the invention is applicable to a variety of package types, including molded and pre-molded plastic, ceramic, and metal packages.

Figure 1:
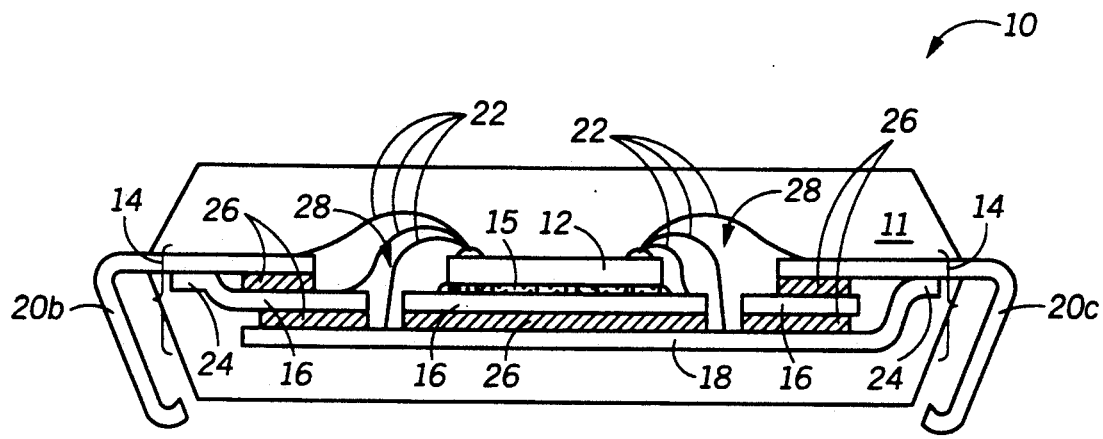
FIG. 1 illustrates, in cross-sectional view, a semiconductor device in accordance with the present invention.

Illustrated in cross-section in FIG. 1 is a semiconductor device 10 in accordance with the present invention. A portion of device 10 is also illustrated in a perspective view in FIG. 2, absent a package body 11. Alternatives to the illustration of device 10 in FIG. 1 may exist. For example, coplanar elements illustrated in FIG. 1 may not lie in a common plane through device 10. In addition, some aspects of the present invention are more clearly illustrated in one of the figures as opposed to the other. Therefore, it is suggested that the reader consult both figures throughout the following discussion.

Device 10 includes a semiconductor die 12, for instance an integrated circuit, attached to an upper voltage plane 16 of a multilayer leadframe 14. Semiconductor die 12 includes a plurality of bond pads 13 which are used to electrically access circuit elements (not shown) of the die. The die is attached to the upper voltage plane using a conventional die attach material, such as a conductive epoxy 15. Leadframe 14 also has a lower voltage plane 18 and a plurality of leads 20a-20c. Leadframe 14, including the upper and lower voltage planes and the plurality of leads, is made from a conventional leadframe material such as copper, a copper alloy, a nickel-iron alloy, or the like. The leads are distinguished in FIG. 1 and FIG. 2 as I/O or signal leads 20a, ground leads 20b, and power leads 20c. Each of these different lead types will be described in more detail below.

Semiconductor die 12 has a plurality of bond pads 13 formed on a surface thereof. Each of the bond pads is electrically coupled to one of the leads or to one of the voltage planes by, for example, a conductive wire 22. Although FIG. 1 illustrates three conductive wires 22 extending from a common point, such as a bond pad on die 12, it is well known in the art that typically only one conductive wire is coupled to any given bond pad. However, a bond pad may be coupled to either a lead or one of the upper and lower voltage planes in accordance with the present invention. Therefore, each of these alternatives is illustrated in FIG. 1. A more representative example of how bond pads 13 are electrically coupled to either a lead or a voltage plane of leadframe 14 is illustrated in FIG. 2.

Each signal lead 20a is electrically coupled to an appropriate bond pad by conductive wire 22. Ground leads 20b may be electrically coupled in the device either: 1) to bond pads 13 of the die; 2) to one of the upper and lower voltage planes; or 3) to both the bond pads and a voltage plane. In a preferred embodiment of the invention, upper voltage plane 16 is a ground plane, therefore ground leads 20b are illustrated as being electrically coupled to the upper voltage plane. Upper voltage plane 16 is electrically coupled to ground leads 20b by either a conductive wire 22, a conductive tab 24, or both, as illustrated in FIG. 1 and FIG. 2. Tabs 24 are integral to a voltage plane and are formed in the voltage plane by a stamping operation. The tabs are then laser or spot welded to the appropriate leads in the device. The welded tabs not only provide electrical connection between the leads and a voltage plane, but also physically attach the voltage plane to the leadframe. Ground potential can be supplied to die 12 directly from one or more ground leads by wire bonding the ground leads to appropriate die bond pads. Alternatively, ground potential can be supplied to the die by wire bonding ground designated bond pads to the ground plane, e.g. upper voltage plane 16, which in turn is electrically coupled to one or more ground leads.

Similarly, power leads 20c are electrically coupled in the device either: 1) to appropriate bond pads of the die; 2) to one of the upper and lower voltage planes; or 3) to both bond pads and a voltage plane. Because upper plane 16 is a ground plane in a preferred embodiment of the present invention, lower plane 18 is preferably a power plane. Lower voltage plane 18 is electrically coupled to power leads 20c by either conductive wires 22, conductive tabs 24, or by both wires and tabs. Power can be supplied to die 12 by directly bonding a conductive wire between power leads 20c and power bond pads. Power can also be supplied to the die by wire bonding power bond pads to the power plane by passing the wire through an opening 28 in the upper voltage plane. The lower voltage plane can then in turn be electrically coupled to power leads by either conductive wires and/or conductive tabs.

Figure 2:
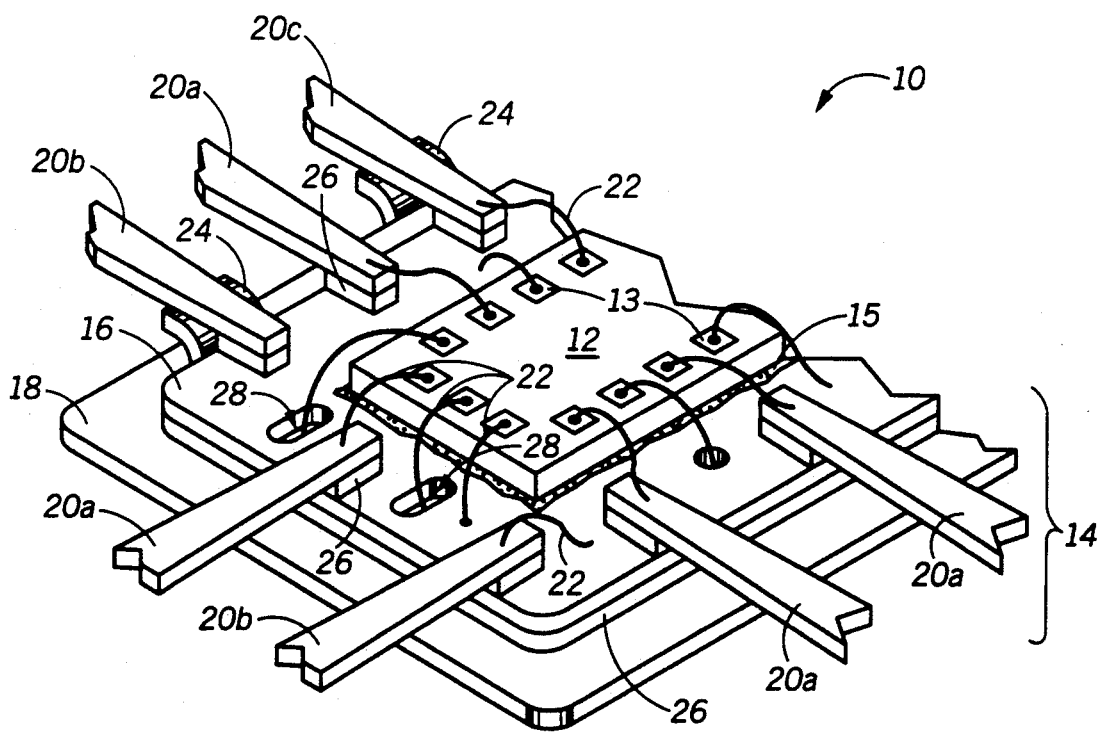
FIG. 2 illustrates, in a cut-away perspective view, the semiconductor device of FIG. 1, also in accordance with the present invention.

In accordance with the present invention, upper voltage plane 16 includes at least one opening 28 to permit passage of a conductive wire 22 used to couple a bond pad to lower voltage plane 18, as illustrated in FIG. 1 and FIG. 2. Opening 28 extends completely through upper voltage plane 16, and exposes a small portion of lower voltage plane 18. The size and shape of openings in the upper voltage plane should be sufficient to permit a wire bonding tool to bond a conductive wire to the lower voltage plane without damaging the leadframe and without short circuiting the conductive wire to the upper plane. For example, for a leadframe thickness of approximately 0.127 mm, a suitable minimum width of opening 28 is on the order of 0.2 to 0.4 mm. The appropriate size of openings used in a device in accordance with the present invention is dependent upon the leadframe material thickness and the size and shape of the bonding tool used to bond the conductive wires. From an electrical performance point of view, openings 28 should be made as small as possible in order to maximize the area of the upper voltage plane. Preferably, openings 28 are circular or oval and are formed in the upper voltage plane by a conventional leadframe stamping operation. Alternatively, the openings may be chemically etched in upper voltage plane 16, in which case opening sidewalls will probably be tapered, as opposed to vertical sidewalls of stamped openings. Openings 28 may also take on other shapes, including square and rectangular shapes among others.

In accordance with the present invention, upper voltage plane 16 and lower voltage plane 18 of device 10 are electrically isolated from one another by an insulating layer 26, as illustrated in FIG. 1 and FIG. 2. To enable a conductive wire to be bonded to lower voltage plane 18, insulating layer 26 is absent from regions surrounding openings 28. In a preferred embodiment of the invention, insulating layer 26 is an adhesive tape which is thermally conductive. Because the voltage planes are relatively large areas, each plane provides thermal dissipation capability. By utilizing a thermally conductive adhesive layer between the planes, thermal dissipation is enhanced. Insulating layer 26 is also used to electrically isolate certain leads 20 from voltage planes 16 and 18. More specifically, signal leads 20a and power leads 20c are electrically isolated from upper voltage plane 16 by insulating layer 26.

One advantage of a device in accordance with the present invention, such as device 10 described above, is that two full voltage planes are available in the device which can be electrically coupled using existing wire bonding techniques. At least one opening is provided in the upper voltage plane to allow a conductive wire to be bonded to the lower voltage plane by passing through the openings. The opening or openings in the upper voltage plane enable both planes to be essentially full voltage planes, with the exception of the openings. Having two full voltage planes has improved electrical performance over existing devices, including lower inductance and reduced simultaneous switching noise.

The present invention has additional advantages over existing semiconductor devices and manufacturing methods. For example, the use of two full conductive planes is an improvement from a thermal dissipation perspective. The thermal dissipation benefit can be further enhanced by providing a thermally conductive, electrically insulative adhesive layer between the two planes. Another advantage in practicing the present invention is that the number of leads required to extend to the die periphery is reduced because bond pads designated as power or ground may be bonded directly to one of the voltage planes instead of to a lead. Power and ground leads can be coupled to the respective voltage planes by laser or spot welding conductive tabs of the planes to the appropriate leads. The only leads which need to extend near the die periphery are I/O or signal leads in order to avoid long conductive bonding wires.

Thus it is apparent that there has been provided, in accordance with the invention, a semiconductor device having a multilayer leadframe with full power and ground planes, and a method for making the same, that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, a preferred embodiment of the present invention utilizes the upper voltage plane as a ground plane and the lower voltage plane as a power plane. It is important to realize, however, that in accordance with the invention, the upper voltage plane may instead be the power plane, while the lower voltage plane is the ground plane. In addition, the invention is not limited to having any particular number of openings formed in the upper voltage plane. The number of openings will vary from device to device, and is dependent on the device's electrical performance requirements. Nor is the invention limited to any specific opening shape or size. It is also important to note that the present invention is not limited in any way to those materials specifically described in reference to the illustrated embodiment. Furthermore, the present invention is not limited to any particular device package type. While a molded plastic package is a preferred embodiment for reasons of cost, other package body types such as ceramic packages, metal packages, and pre-molded plastic packages are also suitable for use in the present invention. Similarly, the present invention is not restricted by the type of semiconductor die used in the device. Nor is the invention limited to using a conductive wire to couple bonding pads of a die to leads and/or voltage planes. Other known coupling mechanisms may instead by used. Therefore, it is intended that this invention encompass all such variations and modifications as fall within the scope of the appended claims.

We claim:

1. A semiconductor device comprising:
   a multilayer metallic leadframe comprising:
      a first full voltage plane;
      a second full voltage plane positioned above the first voltage plane, the first and second voltage planes being electrically insulated from one another, the second voltage plane having a die receiving area;
      an opening extending completely through the second voltage plane and exposing a portion of the first voltage plane, the opening being located outside the die receiving area; and
      a plurality of leads;
   a semiconductor die having a plurality of bond pads formed on a surface thereof, the plurality of bond pads being electrically coupled to the plurality of leads, and the die being attached to the second voltage plane within the die receiving area; and
   a conductive wire electrically coupling one of the plurality of bond pads to the exposed portion of the first voltage plane, the conductive wire passing through the opening in the second voltage plane.

2. The semiconductor device of claim 1 further comprising:
   means to electrically couple a first lead of the plurality of leads to the first voltage plane; and
   means to electrically couple a second lead of the plurality of leads to the second voltage plane.

3. The semiconductor device of claim 2 wherein the first and second voltages planes are respectively ground and power planes of the device.

4. The semiconductor device of claim 2 wherein the first and second voltages planes are respectively power and ground planes of the device.

5. The semiconductor device of claim 1 wherein the metallic leadframe is comprised of a material selected from the group consisting of copper, a copper alloy, and a nickel-iron alloy.

6. The semiconductor device of claim 1 wherein the first and second voltage planes are electrically insulated from one another by an adhesive tape.

7. The semiconductor device of claim 6 wherein the adhesive tape is a thermally conductive adhesive tape.

8. A semiconductor device comprising:
   a multilayer leadframe comprising:
      a continuous first layer of conductive material;
      a second layer of conductive material positioned above the first layer of conductive material, the second layer having first and second opposing surfaces, a die receiving area within one of the first and second opposing surfaces, and at least one opening extending from the first surface to the second surface and being located outside the die receiving area, the second layer of conductive material being substantially continuous apart from the at least one opening and being electrically insulated from the first layer of conductive material; and
      a third layer of conductive material forming a plurality of leads, the third layer being adhesively coupled to at least one of the first and second layers of conductive material;
   a semiconductor die positioned on the second layer of conductive material within the die receiving area such that the at least one opening is uncovered, the semiconductor die having a plurality of bond pads formed on a surface thereof; and means for electrically coupling one of the plurality of bond pads to the first layer of conductive material, the means passing through the at least one opening in the second layer of conductive material.

9. The semiconductor device of claim 8 wherein the means for electrically coupling comprises a conductive wire.

10. The semiconductor device of claim 9 wherein the first and second layers of conductive material are respectively a ground plane and a power plane for the device.

11. The semiconductor device of claim 9 wherein the first and second layers of conductive material are respectively a power plane and a ground plane for the device.

12. The semiconductor device of claim 8 further comprising:

means to electrically couple a first head of the plurality of leads to the first layer of conductive material; and means to electrically couple a second lead of the plurality of leads to the second layer of conductive material.

13. The semiconductor device of claim 8 further comprising a plastic encapsulating material which surrounds the semiconductor die, the first and second layers of conductive material, and portions of the plurality of leads.

14. The semiconductor device of claim 1 wherein first voltage plane is physically and electrically coupled to at least a first lead of the plurality of leads and the second voltage plane is physically and electrically coupled to at least a second lead of the plurality of leads.

15. The semiconductor device of claim 1 wherein the first voltage plane is coupled to at least the first lead and the second voltage plane is coupled to at least the second lead by welds.

* * * * *

UNITED STATES PATENT AND TRADEMARK OFFICE
CERTIFICATE OF CORRECTION

PATENT NO. : 5,220,195

DATED : June 15, 1993

INVENTOR(S) : Michael B. McShane/Rolando Osorio

It is certified that error appears in the above-identified patent and that said Letters Patent is hereby corrected as shown below:

In claim 12, column 8, line 1
    after "first", change "head" to --lead--.

Signed and Sealed this

Third Day of May, 1994

Attest:

BRUCE LEHMAN

Attesting Officer      Commissioner of Patents and Trademarks